(12) United States Patent
Korenari et al.

(10) Patent No.: US 7,294,881 B2
(45) Date of Patent: Nov. 13, 2007

(54) NONVOLATILE SEMICONDUCTOR MEMORY HAVING A CHARGE ACCUMULATION LAYER CONNECTED TO A GATE

(75) Inventors: Takahiro Korenari, Tokyo (JP); Kenji Sera, Tokyo (JP); Hiroshi Kanou, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/047,814

(22) Filed: Feb. 2, 2005

(65) Prior Publication Data

US 2005/0167668 A1 Aug. 4, 2005

(30) Foreign Application Priority Data

Feb. 4, 2004 (JP) ............................. 2004-028641

(51) Int. Cl.
*H01L 29/76* (2006.01)
(52) U.S. Cl. ...................... 257/314; 257/315; 257/316; 257/317; 257/296; 257/318
(58) Field of Classification Search ................ 257/67, 257/350, 351, 314, 347; 438/152, 311
See application file for complete search history.

(56) References Cited

U.S. PATENT DOCUMENTS 5,321,286 A * 6/1994 Koyama et al. ............. 257/315
6,525,379 B2 * 2/2003 Nomoto et al. ............. 257/347
6,781,178 B2 * 8/2004 Shizukuishi ................ 257/296
2002/0025429 A1 * 2/2002 Fukui et al. ................. 428/341
2004/0108543 A1 * 6/2004 Yamazaki et al. .......... 257/316

FOREIGN PATENT DOCUMENTS

JP 11-87545 3/1999

* cited by examiner

*Primary Examiner*—Evan Pert
*Assistant Examiner*—Tan Tran
(74) *Attorney, Agent, or Firm*—Young & Thompson

(57) ABSTRACT

At least either above or below a memory transistor formed on an insulating substrate, a shielding layer which has an area larger than that of the semiconductor layer of the memory transistor and has either an electromagnetic wave shielding effect or a light shielding effect or both of these is provided, and by this shielding layer, electromagnetic waves or light is prevented from entering the semiconductor layer. Or, the regional area of at least one of the gate and the charge accumulation layer of the memory transistor is made larger than the semiconductor layer to prevent electromagnetic waves or light from entering the semiconductor layer by the gate or the charge accumulation layer.

9 Claims, 14 Drawing Sheets

NONVOLATILE SEMICONDUCTOR MEMORY HAVING A CHARGE ACCUMULATION LAYER CONNECTED TO A GATE

BACKGROUND OF THE INVENTION

1. Field of the Invention

The present invention relates to nonvolatile semiconductor memory having a charge accumulation layer and a manufacturing method for the same.

2. Description of the Related Art

Recently, in conjunction with technical development, centered on flash memories having floating gate structures, nonvolatile semiconductor memory having various structures and constructions have been studied and developed. For example, in view of manufacturing cost reduction, a nonvolatile memory having a floating gate structure formed with a thin film transistor on an insulating substrate made of glass or plastic has been proposed (for example, refer to Japanese Patent Laid-Open Publication No. 87545/1999). In Japanese Patent Laid-Open Publication No. 87545/1999, a nonvolatile memory constructed so that a base insulating layer is formed on an insulating substrate, and on the base insulating layer, a semiconductor layer, an insulating layer, a floating gate (charge accumulation layer), an insulating layer, and a control gate are layered in this order is disclosed.

The nonvolatile memory thus constructed is provided with a charge accumulation layer having a function for holding charges between the control gate and the channel forming region in the semiconductor layer, so that by applying a proper voltage to the control gate and the semiconductor layer, carriers are injected from the semiconductor layer into the charge accumulation layer, or carriers are discharged from the charge accumulation layer to the semiconductor layer. When charges are accumulated in the charge accumulation layer, the threshold voltage of the transistor changes, and accordingly, data storing becomes possible. For example, data is erased by accumulating charges in the charge accumulation layer, and data is written by discharging charges accumulated in the charge accumulation layer.

However, the above-mentioned prior art has the following problems. First, depending on the characteristics of the insulating layer between the semiconductor layer and the charge accumulation layer, when carriers are injected into the charge accumulation layer by applying a voltage to the control gate and the semiconductor layer, the injected carriers are captured in the insulating layer or the quality of the insulating layer changes due to influence from the injection of carriers, resulting in change in threshold voltage of the transistor. If the threshold voltage of the transistor thus changes, threshold voltages in the erasing and writing states are changed, so that the reading margin lowers and discrimination between a writing state and an erasing state becomes difficult.

Second, irradiation of electromagnetic waves or light increases a leak current in the broad sense of the term, resulting in difficulty in discrimination between a writing state and an erasing state.

SUMMARY OF THE INVENTION

An object of the invention is to provide nonvolatile semiconductor memory and a manufacturing method for the same, wherein even when carriers are captured in the insulating layer between the control gate and the semiconductor layer, or the insulating quality changes, change in threshold voltage of the transistor in reading is small, and even when electromagnetic waves or light is irradiated, a leak current in the broad sense of the term does not increase, and discrimination between a writing state and an erasing state can be made stably.

A nonvolatile semiconductor memory relating to the invention comprises an insulating substrate, a memory transistor which is formed on the insulating substrate and includes a semiconductor layer having a source region, a drain region, and a channel region formed between said regions, a charge accumulation layer electrically connected to the channel region via a first insulating layer, a first gate electrically connected to the charge accumulation layer via a second insulating layer, and a shielding layer having an electromagnetic wave shielding effect or a light shielding effect, or having both the electromagnetic shielding effect and the light shielding effect formed on at least one of the upper side or the lower side of the memory transistor.

The shielding layer may be formed in an area larger than the semiconductor layer so as to cover the portion immediately below or immediately above the semiconductor layer.

Furthermore, it is also possible that in the memory transistor, the charge accumulation layer is formed on the channel region via the first insulating layer, and the first gate is formed on the charge accumulation layer via the second insulating layer, and furthermore, it is also possible that a second gate that is formed below the channel region and electrically connected to the channel region via a third insulating layer is provided.

Or, it is also possible that, in the memory transistor, the charge accumulation layer is formed on the first gate via the second insulating layer, and the channel region is formed on the charge accumulation layer via the first insulating layer, and a second gate that is formed above the channel and electrically connected to the channel region via a third insulating layer is provided.

Another nonvolatile semiconductor memory relating to the invention comprises an insulating substrate, and a memory transistor which is formed on the insulating substrate and includes a semiconductor layer having a source region, a drain region, and a channel region formed between the source region and the drain region, a charge accumulation layer electrically connected to the channel region via a first insulating layer, and a first gate electrically connected to the charge accumulation layer via a second insulating layer. At least one of the charge accumulation layer and the first gate is formed in an area larger than the semiconductor layer so as to cover the portion immediately above or immediately below the semiconductor layer.

In the memory transistor, for example, the charge accumulation layer is formed on the channel region via the first insulating layer, and the first gate having an area larger than the semiconductor layer is formed on the charge accumulation layer via the second insulating layer. It is also possible that the charge accumulation layer is formed in an area larger than the semiconductor layer so as to cover the portion immediately above or immediately below the semiconductor layer. It is also possible that the memory transistor has a second gate that is formed below the channel region and electrically connected to the channel region via a third insulating layer.

Or, in the memory transistor, for example, the charge accumulation layer is formed on the first gate with an area larger than the semiconductor layer via the second insulting layer, and the channel region is formed on the charge accumulation layer via the first insulating layer. It is also possible that the charge accumulation layer is formed in an area larger than the semiconductor layer so as to cover the portion immediately above or immediately below the semiconductor layer. The memory transistor may be further provided with a second gate that is formed above the channel region and electrically connected to the channel region via a third insulating layer.

Another nonvolatile semiconductor memory relating to the invention comprises an insulating substrate, and a memory transistor which is formed on the insulating substrate and includes a semiconductor layer having a source region, a drain region, and a channel region formed between the source region and the drain region, a charge accumulation layer electrically connected to the channel region via a first insulating layer, a first gate electrically connected to the charge accumulation layer via a second insulating layer, and a second gate which is electrically connected to the channel region via a third insulating layer and formed in an area larger than the semiconductor layer so as to cover the portion immediately above or immediately below the semiconductor layer.

In the memory transistor, it is also possible that the channel region is formed on the second gate via the third insulating layer, the charge accumulation layer is formed on the channel region via the first insulating layer, and the first gate is formed on the charge accumulation layer via the second insulating layer.

Or, in the memory transistor, it is also possible that the charge accumulation layer is formed on the first gate via the second insulating layer, the channel region is formed on the charge accumulation layer via the first insulating layer, and the second gate is formed on the channel region via the third insulating layer.

Furthermore, in the above-mentioned nonvolatile semiconductor memory, the insulating substrate is formed of, for example, glass or plastic.

A manufacturing method for a nonvolatile semiconductor memory relating to the invention comprises the steps of forming a first shielding layer having either an electromagnetic wave shielding effect or a light shielding effect or both of these on an insulating substrate, forming a source region and a drain region by doping a semiconductor layer with impurities after forming the semiconductor layer in an area narrower than the shielding layer on the shielding layer and forming the region between the source region and the drain region as a channel region, forming a charge accumulation layer on the channel region via a first insulating layer, and forming a first gate on the charge accumulation layer via a second insulating layer.

This manufacturing method for a nonvolatile semiconductor memory may further have the step of forming a second shielding layer that has either an electromagnetic wave shielding effect or a light shielding effect or both of these in an area larger than the semiconductor layer above the first gate so as to cover the portion immediately above the semiconductor layer after forming the first gate.

Another manufacturing method for a nonvolatile semiconductor memory relating to the invention comprises the steps of forming a semiconductor layer on an insulating substrate and then forming a source region and a drain region by doping this semiconductor layer with impurities and forming a channel region between the source region and the drain region, forming a charge accumulation layer on the channel region via a first insulating layer, forming a first gate on the charge accumulation layer via a second insulating layer, and forming a shielding layer which has either an electromagnetic wave shielding effect or a light shielding effect or both of these on the first gate in an area larger than the semiconductor layer so as to cover the portion immediately above the semiconductor layer.

It is also possible that the method further has a step of forming a second gate electrically connected to the channel region via a third insulating layer between the first shielding layer and the semiconductor layer.

A manufacturing method for a nonvolatile semiconductor memory relating to the invention comprises the steps of forming a shielding layer that has either an electromagnetic wave shielding effect or a light shielding effect or both of these on an insulating substrate, forming a first gate on the shielding layer, forming a charge accumulation layer on the first gate via a second insulating layer, forming a first insulating layer so as to cover the charge accumulation layer, and forming a semiconductor layer in an area narrower than the shielding layer on the first insulating layer and then forming a source region and a drain region by doping the semiconductor layer with impurities and forming the portion of the semiconductor layer immediately above the charge accumulation layer as a channel region.

This manufacturing method for a nonvolatile semiconductor memory may further have a step of forming a second shielding layer which has either an electromagnetic wave shielding effect or a light shielding effect or both of these in an area larger than the semiconductor layer so as to cover the portion immediately above the semiconductor layer.

Another manufacturing method for a nonvolatile semiconductor memory relating to the invention comprises the steps of forming a first gate on an insulating substrate, forming a charge accumulation layer on the first gate via a second insulating layer, forming a first insulating layer so as to cover the charge accumulation layer, forming a semiconductor layer in an area narrower than the shielding layer on the first insulating layer and then forming a source region and a drain region by doping the semiconductor layer with impurities and forming the portion of the semiconductor layer immediately above the charge accumulation layer as a channel region, and forming a second shielding layer that has either an electromagnetic wave shielding effect or a light shielding effect or both of these in an area larger than the semiconductor layer so as to cover the portion immediately above the semiconductor layer.

The method may further have a step of forming a second gate electrically connected to the channel region via a third insulating layer between the second shielding layer and the semiconductor layer.

Another manufacturing method for a nonvolatile semiconductor memory relating to the invention comprises the steps of forming a semiconductor layer on an insulating substrate and then forming a source region and a drain region by doping the semiconductor layer with impurities and forming the region between the source region and the drain region as a channel region, forming a charge accumulation layer on the channel region via a first insulating layer, and forming a first gate on the charge accumulation layer via a second insulating layer. At least one of the charge accumulation layer and the first gate is formed in an area larger than the semiconductor layer so as to cover the portion immediately above the semiconductor layer.

This manufacturing method for a nonvolatile semiconductor memory may further have a step of forming a second gate electrically connected to the channel region via a third insulating layer between the insulating substrate and the semiconductor layer.

Another manufacturing method for a nonvolatile semiconductor memory relating to the invention comprises the steps of forming a first gate on an insulating substrate, forming a charge accumulation layer on the first gate via a second insulating layer, forming a first insulating layer so as to cover the charge accumulation layer, and forming a semiconductor layer on the first insulating layer and then forming a source region and a drain region by doping the semiconductor layer with impurities and forming the portion of the semiconductor layer immediately above the charge accumulation layer as a channel region. At least one of the charge accumulation layer and the first gate is formed in an area larger than the semiconductor layer so as to cover the portion immediately below the semiconductor layer.

The manufacturing method for a nonvolatile semiconductor memory may further have a step of forming a second gate electrically connected to the channel region via a third insulating layer on the channel region.

The insulating substrate is formed of, for example, glass or plastic. Furthermore, the above-mentioned manufacturing method for a nonvolatile semiconductor memory may have a step of crystallizing the semiconductor layer by an excimer laser annealing method or low-temperature solid crystallization method. Furthermore, in the manufacturing method for a nonvolatile semiconductor memory, all steps can be carried out under a temperature condition of 600° C. or less.

According to the invention, a control gate for writing and erasing and a gate for reading are formed independently from each other, and these are arranged so as to be opposite each other across the semiconductor layer, so that when injecting carriers from the semiconductor layer into the charge accumulation layer, even when a part of the carriers is captured in the insulating layer or the insulating layer quality changes due to carrier injection, the threshold voltage for the read-only gate is restrained from changing, whereby the reading margin is restrained from lowering. Furthermore, a layer having an electromagnetic wave shielding effect and a light shielding effect is provided or the entire surface above or below the region of the semiconductor layer is covered by the charge accumulation layer and the control gate and read-only gate having areas larger than the area of the semiconductor layer, so that electromagnetic waves and light are prevented from entering the semiconductor active layers, and the leak current is not increased even by irradiation of electromagnetic waves or light. Thereby, discrimination between a writing state and an erasing state can be stably made.

DETAILED DESCRIPTION OF THE PREFERRED EMBODIMENTS

Figure 1:
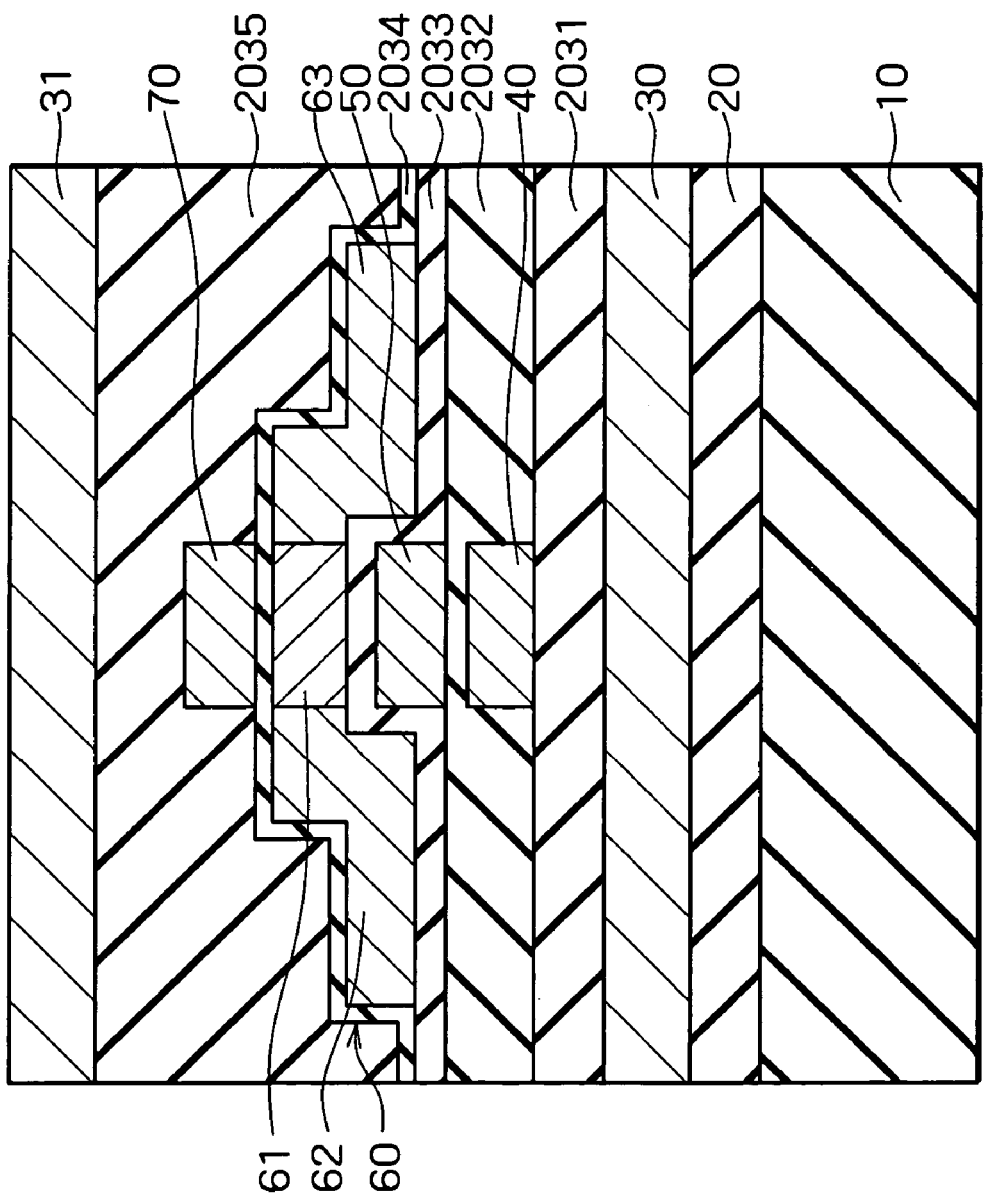
FIG. 1 is a sectional view showing the configuration of a nonvolatile semiconductor memory of a first embodiment of the invention.

Hereinafter, embodiments of the invention are described in detail with reference to the accompanying drawings. First, a nonvolatile semiconductor memory relating to a first embodiment of the invention is described. FIG. 1 is a sectional view showing the configuration of the nonvolatile semiconductor memory of the first embodiment of the invention. In the nonvolatile semiconductor memory of this embodiment, a base insulating layer 20 is formed on an insulating substrate 10 made of glass or plastic. On the base insulating layer 20, a shielding layer 30 having an electromagnetic wave shielding effect or a light shielding effect or both of these is formed. On the shielding layer 30, a control gate 40 is provided via an insulating layer 2031, and on the insulating layer 2031, an insulating layer 2032 is formed so as to cover the control gate 40. Furthermore, on the insulating layer 2032, a charge accumulation layer 50 is provided on the portion immediately above the control gate 40, and an insulating layer 2033 is formed so as to cover this charge accumulation layer 50.

On the insulating layer 2033, a semiconductor layer 60 is provided, and on the portion of the semiconductor layer 60 immediately above the charge accumulation layer 50, a channel region 61 is formed. And on both sides of the channel region 61, a source region 62 and a drain region 63 are formed, respectively. Furthermore, an insulating layer 2034 is formed so as to cover this semiconductor layer 60, and above the channel region 61, a read-only gate 70 is provided via the insulating layer 2034. Furthermore, on the insulating layer 2034, an insulating layer 2035 is formed so as to cover the read-only gate 70, and on this insulating layer 2035, a shielding layer 31 having either an electromagnetic wave shielding effect or a light shielding effect or both of these is formed. Thus, in the nonvolatile semiconductor memory of this embodiment, shielding layers 30 and 31 having areas larger than that of the semiconductor layer 60 are formed above and below the semiconductor layer 60.

Next, operations of the nonvolatile semiconductor memory of this embodiment are described. In the nonvolatile semiconductor memory of this embodiment, when a predetermined voltage is applied to the source region 62 and the drain region 63 formed in the semiconductor layer 60 and the control gate 40, a Fowler Nordheim tunneling current is generated, and electrons move between the channel region 61 and the charge accumulation layer 50 through the insulating layer 2033. When charges are accumulated in the charge accumulation layer 50, an electrical field is generated, so that the threshold voltage of the transistor changes and data is stored. Furthermore, to read data, for example, a middle current between a threshold voltage in an erasing state and a threshold voltage in a writing state is applied to the read-only gate 70 and it is measured whether or not a current flows between the source region 62 and the drain region 63.

In the nonvolatile semiconductor memory of this embodiment, the gate for writing and erasing is the control gate 40, and the gate for reading is the read-only gate 70, whereby the gate for writing or erasing and the gate for reading are separated from each other. Since the read-only gate 70 is thus provided on the semiconductor layer 60 via the insulating layer 2034, when carriers are injected from the semiconductor layer 60 into the charge accumulation layer 50, even if a part of the carriers is captured in the insulating layer 2033 or the quality of the insulating layer 2033 changes due to carrier injection, the change in threshold voltage for the read-only gate 70 is smaller than the change in threshold voltage for the control gate 40, and therefore, lowering in reading margin can be restrained.

Furthermore, in the nonvolatile semiconductor memory of this embodiment, two control gates including the control gate 40 and the read-only gate 70 are provided, so that the following two effects are obtained. As a first effect, when writing or erasing is carried out by the control gate 40, a voltage can be applied to the read-only gate 70. This voltage can also be used for acceleration of the writing or erasing, and when the control gate voltage necessary for writing or erasing changes, it can also be used as a bias source for compensating this change. The voltage can also be used for reducing the electrical field inside the element. As a second effect, the read-only gate 70 can be provided with another function. For example, it is also possible that the control gate 40 carries out writing only, and erasing is carried out by the read-only gate 70. Thus, by carrying out writing and erasing by gates different from each other, the time to be taken for writing and erasing can be shortened.

Furthermore, in the nonvolatile semiconductor memory of this embodiment, the shielding layers 30 and 31 are provided, respectively, above and below the semiconductor layer 60, and the areas of the shielding layers 30 and 31 are formed larger than that of the semiconductor layer 60, so that electromagnetic waves and light can be effectively prevented from entering the semiconductor layer 60. Thereby, a leak current in the broad sense of the term is significantly reduced, and discrimination between a writing state and an erasing state can be made stably. Furthermore, the shielding layers 30 and 31 have metallic properties, and may be made of, for example, a semiconductor material doped with metal materials and impurities, or the like.

Next, a manufacturing method for the nonvolatile semiconductor memory of this embodiment is described. First, on an insulating substrate 10 which is a glass substrate or a plastic substrate, silicon oxide or silicon nitride is deposited by sputtering or CVD (Chemical Vapor Deposition) to form a base insulating layer 20 with thickness of, for example, approximately 300 nm. On the base insulating layer 20 thus formed, by sputtering, tungsten silicide, amorphous silicon, chromium, etc., are deposited or amorphous silicon or the like is deposited by CVD to form a shielding layer 30. When the shielding layer 30 is made of amorphous silicon, it is desirable that impurities are introduced during deposition, or impurities are implanted after an amorphous silicon layer and then the implanted ions are activated by annealing according to an excimer laser annealing method or a rapid thermal annealing method to lower the resistance of the shielding layer 30. It is preferable that the thickness of the shielding layer 30 is 300 nm or more.

Next, on the shielding layer 30, by the same method as that for the above-mentioned base insulating layer 20, an insulating layer 2031 with thickness of, for example, 50 nm or more is formed. Then, polysilicon, tungsten silicide, or chromium, etc., is deposited by sputtering or CVD on the insulating layer 2031 to form a control gate 40 with thickness of, for example, 100 nm or more.

Next, by the same method as that for the base insulating layer 20, an insulating layer 2032 with thickness of 10 to 200 nm is formed so as to cover the control gate 40. Furthermore, as the insulating layer 2032, it is also possible that an ONO layer (HTO/SiN/HTO), that is, a layered insulating layer obtained by layering an oxide layer, a nitride layer, and an oxide layer is formed by CVD. Thereafter, on the insulating layer 2032, by the same method as that for the control gate 40, a charge accumulation layer 50 is formed. The thickness of this charge accumulation layer 50 is, for example, 100 nm or more.

Continuously, an insulating layer 2033 with thickness of approximately 8 to 40 nm is formed so as to cover the charge accumulation layer 50 by the same method as that for the base insulating layer 20. On this insulating layer 2033, by sputtering or CVD, a silicon layer is deposited to thickness of, for example, 10 to 200 nm, and thereafter, etching is performed to form a semiconductor layer 60. Thereafter, by ion implantation or ion doping, impurities are implanted with a high concentration in the source region 62 and the drain region 63. For forming the semiconductor layer 60, it is desirable that channel doping is performed to introduce impurities when depositing the silicon layer in the channel region, or after depositing the silicon layer, impurities with a low concentration are implanted by ion implantation or ion doping to obtain a desired threshold. In this case, after channel doping, it is desirable that the silicon layer is crystallized by excimer laser annealing or solid-phase growth. Thereby, the carrier mobility of the silicon layer 60 can be increased, and the sub-threshold swing value is lowered due to lowering in the trap level of silicon, and the transistor performance can be made higher.

Next, by the same method as that for the base insulating layer 20, an insulating layer 2034 with thickness of 8 to 40 nm is formed so as to cover the semiconductor layer 60. Then, by using the same material and method as those for the control gate 40, a read-only gate 70 with thickness of, for example, 100 nm or more is formed on the insulating layer 2034. Furthermore, by the same method as that for the base insulating layer 20, an insulating layer 2035 with thickness of, for example, 8 to 40 nm is formed on the insulating layer 2034 so as to cover the read-only gate 70. Furthermore, on this insulating layer 2035, by using the same material and method as those for the shielding layer 30, a shielding layer 31 with thickness of, for example, 300 nm or more is formed.

It is also possible that the control gate 40, the read-only gate 70, and the shielding layers 30 and 31 are used as wiring by being patterned by photolithography and etching.

It is desirable that all the above-mentioned manufacturing processes are performed at 600° C. or less. Thereby, use of an inexpensive glass substrate or plastic substrate becomes possible.

Figure 2:
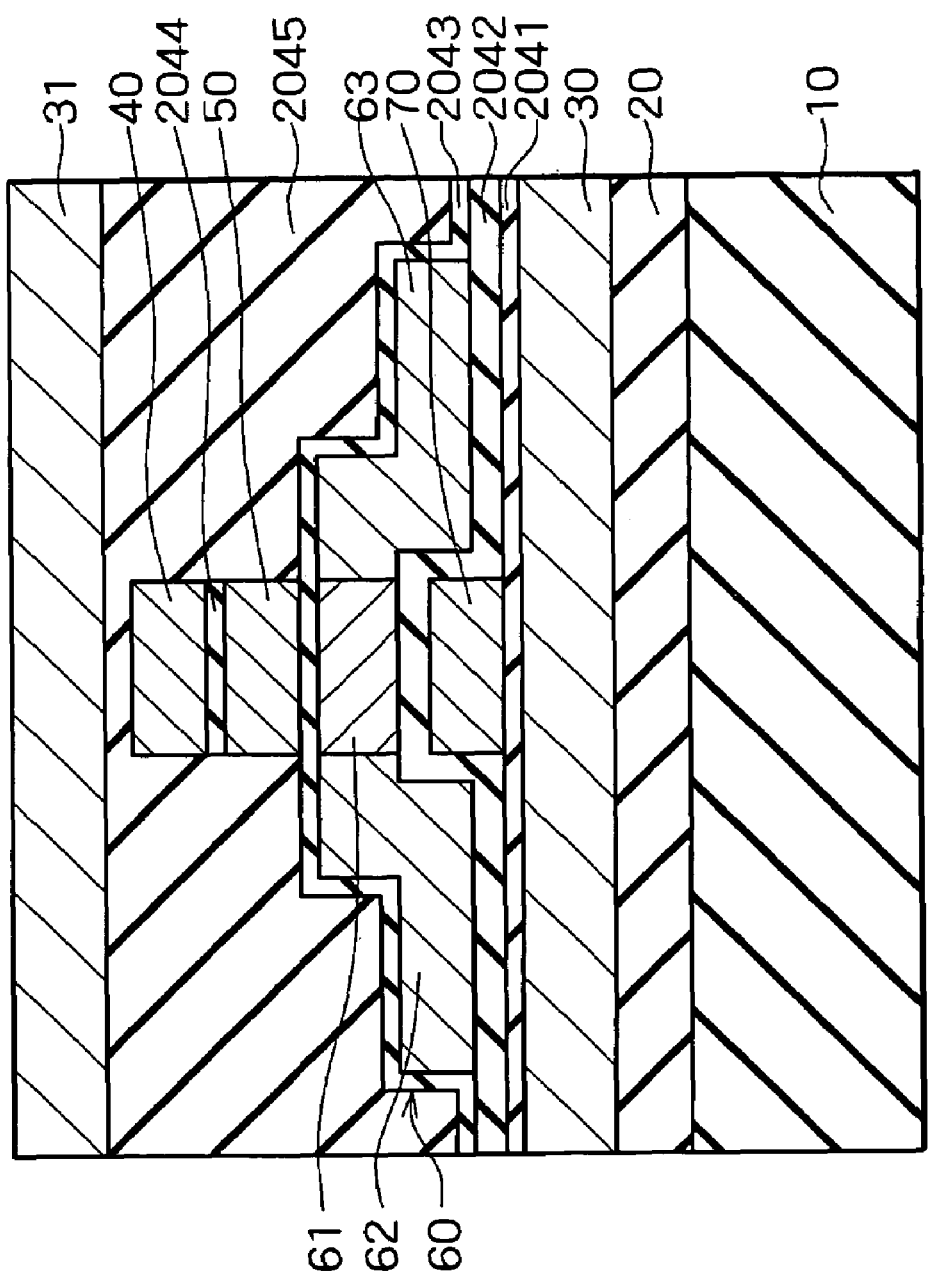
FIG. 2 is a sectional view showing the configuration of a nonvolatile semiconductor memory of a second embodiment of the invention.

Next, a nonvolatile semiconductor memory according to a second embodiment of the invention is described. FIG. 2 is a sectional view showing the configuration of the nonvolatile semiconductor memory of the second embodiment of the invention. In FIG. 2, the same components as those of the nonvolatile semiconductor memory shown in FIG. 1 are attached with the same symbols, and detailed description thereof is omitted. As shown in FIG. 2, in the nonvolatile semiconductor memory of this embodiment, a read-only gate 70 is formed on the insulating layer 2041, and on this read-only gate, a channel region 61 is formed via an insulating layer 2042. Furthermore, a charge accumulation layer 50 is formed on the channel region 61 via a gate insulating layer 2043, and a control gate 40 is formed on the charge accumulation layer 50 via an insulating layer 2044.

As in the case of the nonvolatile semiconductor memory of this embodiment, even if the control gate 40 and the charge accumulation layer 50 are formed above the semiconductor layer 60 and the read-only gate 70 is formed below the semiconductor layer 60, the same effects as those of the semiconductor nonvolatile semiconductor device of the above-mentioned first embodiment can be obtained. The construction and operations of the nonvolatile semiconductor memory of this embodiment except for the above-mentioned points are the same as those of the nonvolatile semiconductor memory of the first embodiment.

Figure 3:
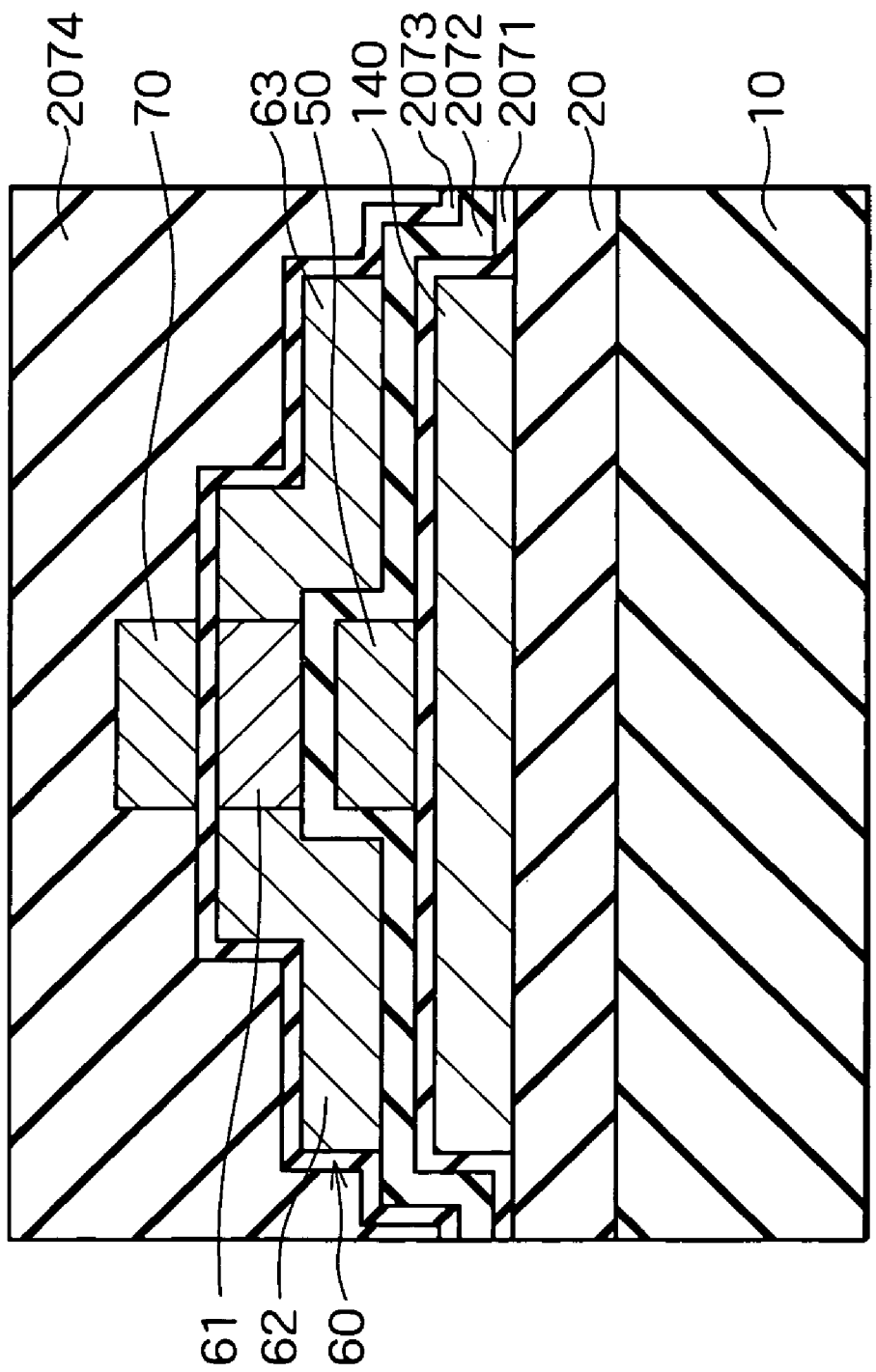
FIG. 3 is a sectional view showing the configuration of a nonvolatile semiconductor memory of a third embodiment of the invention.

Next, a nonvolatile semiconductor memory relating to a third embodiment of the invention is described. FIG. 3 is a sectional view showing the configuration of the nonvolatile semiconductor memory of the third embodiment of the invention. In FIG. 3, the same components as those of the nonvolatile semiconductor memory shown in FIG. 1 are attached with the same symbols, and detailed description thereof is omitted. As shown in FIG. 3, in the nonvolatile semiconductor memory of this embodiment, a base insulating layer 20 is formed on an insulating substrate 10 made of glass or plastic, and on this base insulating layer 20, a control gate 140 with an area larger than that of the semiconductor layer 60 is provided, and the shielding layer is not provided.

In the nonvolatile semiconductor memory of this embodiment, no shielding layers are provided, and the region below the semiconductor layer 60 is entirely covered by the control gate 140. Namely, the control gate 140 functions as a shielding layer. Thereby, electromagnetic waves and light entering the semiconductor layer from below can be shielded, so that discrimination between a writing state and an erasing state can be made stably. Furthermore, the control gate 140 is also commonly used as a shielding layer, so that the manufacturing processes can be made simpler than those for the nonvolatile semiconductor memory of the first and second embodiments. The construction, operations, and effects of the nonvolatile semiconductor memory of this embodiment except for the above-mentioned points are the same as those of the nonvolatile semiconductor memory of the first embodiment.

Figure 4:
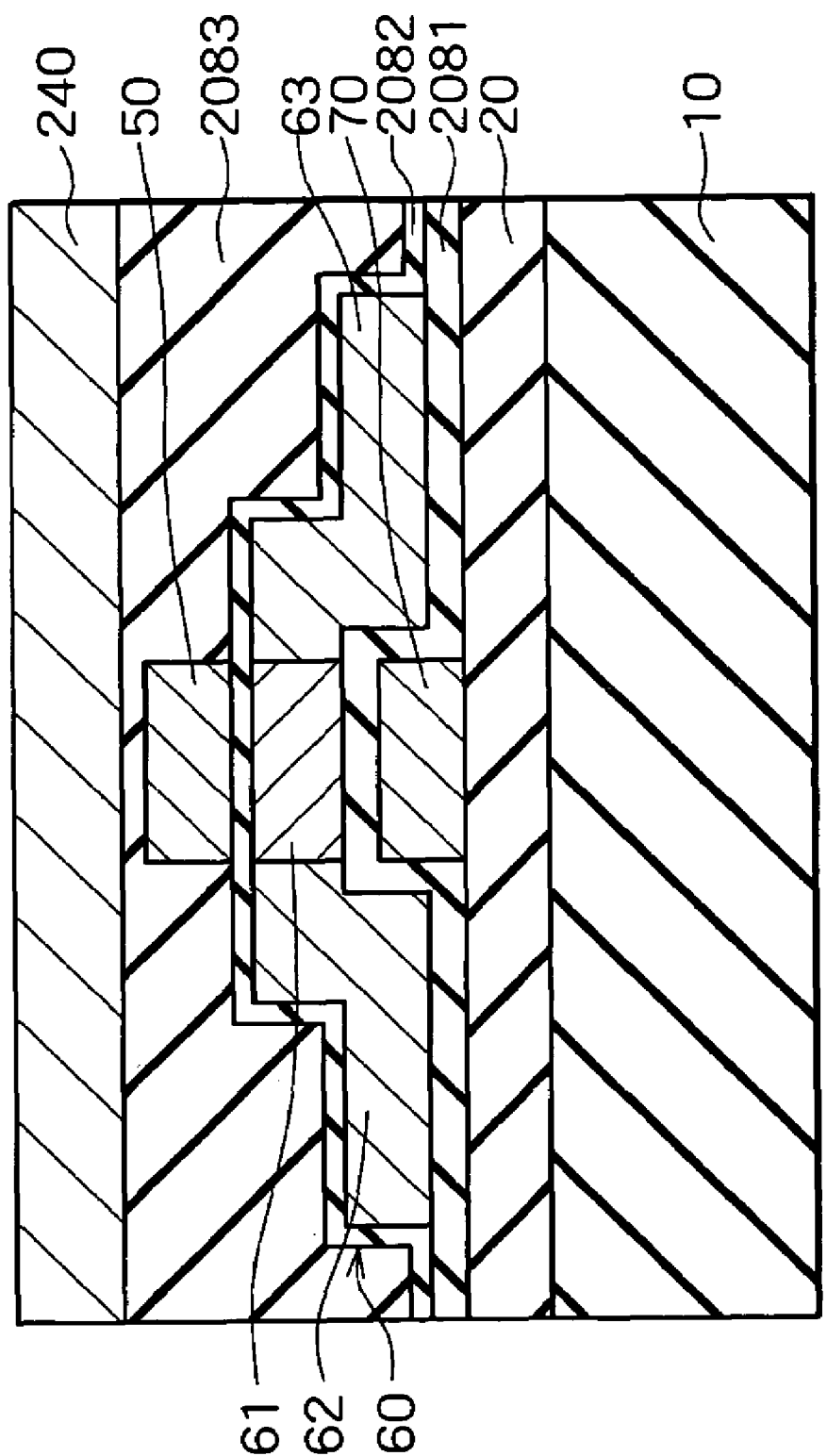
FIG. 4 is a sectional view showing the configuration of a nonvolatile semiconductor memory of a fourth embodiment of the invention.

Next, a nonvolatile semiconductor memory relating to a fourth embodiment of the invention is described. FIG. 4 is a sectional view showing the configuration of the nonvolatile semiconductor memory of the fourth embodiment of the invention. In FIG. 4, the same components as those of the nonvolatile semiconductor memory shown in FIG. 1 through FIG. 3 are attached with the same symbols, and detailed description thereof is omitted. As shown in FIG. 4, in the nonvolatile semiconductor memory of this embodiment, a base insulating layer 20 is formed on an insulating substrate 10 made of glass or plastic, and on this base insulating layer 20, a read-only gate 70 is formed. Furthermore, an insulating layer 2081 is formed so as to cover the read-only gate 70, and on this insulating layer 2081, a semiconductor layer 60 is formed. Furthermore, an insulating layer 2082 is formed so as to cover the semiconductor layer 60, and in the portion of the insulating layer 2082 immediately above the channel region 61 of the semiconductor layer 60, a charge accumulation layer 50 is formed. On the insulating layer 2082, an insulating layer 2083 is formed so as to cover the charge accumulation layer 50, and on this insulating layer 2083, a control gate 240 having an area larger than that of the semiconductor layer 60 is provided.

Thus, in the nonvolatile semiconductor memory of this embodiment, in place of a shielding layer, a control gate 240 with an area larger than that of the semiconductor layer 60 is provided above the semiconductor layer 60 so as to cover the entirely the region above the semiconductor layer 60. In this nonvolatile semiconductor memory, the control gate 240 functions as a shielding layer, and shields electromagnetic waves or light entering the semiconductor layer 60 from above. As a result, discrimination between a writing state and an erasing state can be made stably, and the manufacturing processes can be simplified. The effects and operations of the nonvolatile semiconductor memory of this embodiment except for the above-mentioned points are the same as those of the nonvolatile semiconductor memory of the second embodiment.

Figure 5:
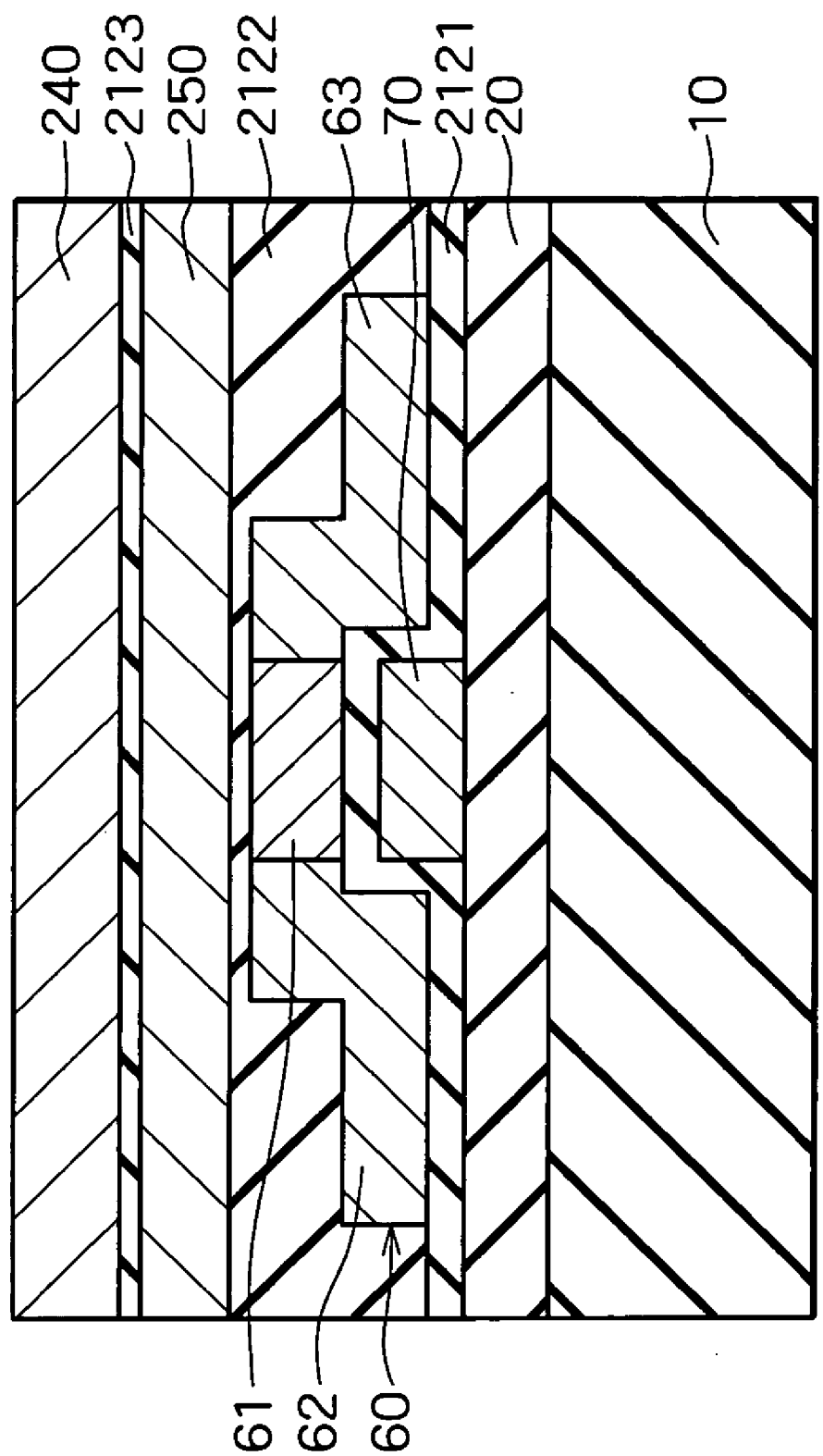
FIG. 5 is a sectional view showing the configuration of a nonvolatile semiconductor memory of a fifth embodiment of the invention.

Next, a nonvolatile semiconductor memory relating to a fifth embodiment of the invention is described. FIG. 5 is a sectional view showing the configuration of the nonvolatile semiconductor memory of the fifth embodiment of the invention. In FIG. 5, the same components as those of the nonvolatile semiconductor memory shown in FIG. 1 through FIG. 4 are attached with the same symbols, and detailed description thereof is omitted. As shown in FIG. 5, in the nonvolatile semiconductor memory of this embodiment, a charge accumulation layer 250 with an area larger than that of the semiconductor layer 60 is provided above the semiconductor layer 60, and a control gate 240 with an area larger than that of the semiconductor layer 60 is provided on the charge accumulation layer 250 via an insulating layer 2123.

Thus, in the nonvolatile semiconductor memory of this embodiment, the charge accumulation layer 250 and the control gate 240 having areas larger than the area of the semiconductor layer 60 are provided above the semiconductor layer 60, whereby electromagnetic waves or light is prevented from entering the semiconductor layer 60 from above. In this nonvolatile semiconductor memory, the charge accumulation layer 250 is formed to be larger in area than the semiconductor layer 60 as well as the control gate 240, so that the electromagnetic wave and light shielding effect is improved more than in the nonvolatile semiconductor memory of the above-mentioned fourth embodiment. The construction, operations, and effects of the nonvolatile semiconductor memory of this embodiment except for the above-mentioned points are the same as those of the nonvolatile semiconductor memory of the fourth embodiment.

Figure 6:
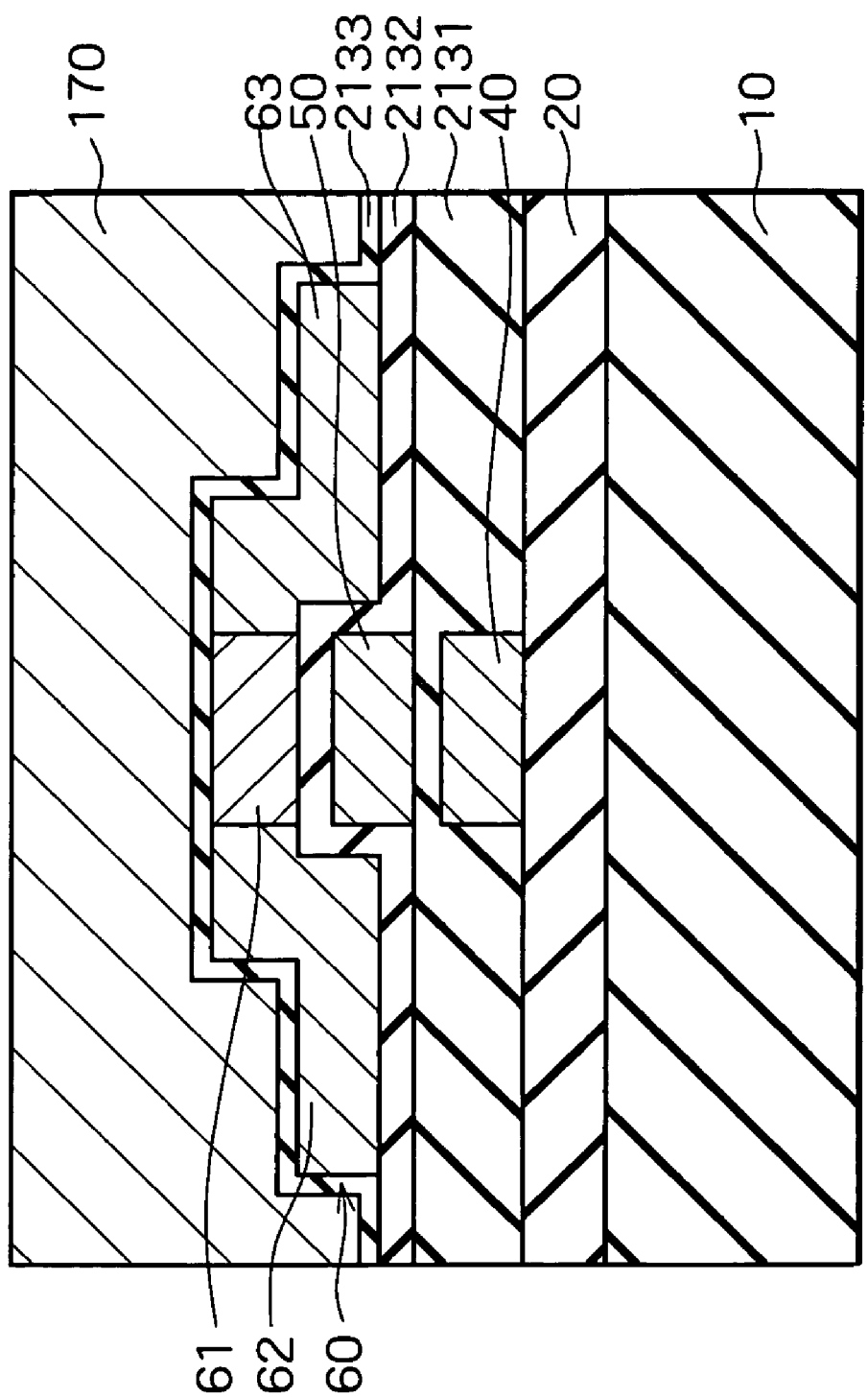
FIG. 6 is a sectional view showing the configuration of a nonvolatile semiconductor memory of a sixth embodiment of the invention.

Next, a nonvolatile semiconductor memory relating to a sixth embodiment of the invention is described. FIG. 6 is a sectional view showing the configuration of the nonvolatile semiconductor memory of the sixth embodiment of the invention. In FIG. 6, the same components as those of the nonvolatile semiconductor memory shown in FIG. 1 through FIG. 5 are attached with the same symbols, and detailed description thereof is omitted. As shown in FIG. 6, in the nonvolatile semiconductor memory of this embodiment, on an insulating substrate 10 made of glass or plastic, a base insulating layer 20 is formed, and on this base insulating layer 20, a control gate 40 is formed. Furthermore, on the base insulating layer 20, an insulating layer 2131 is formed so as to cover the control gate 40, and on the portion of the insulating layer 2131 immediately above the control gate 40, a charge accumulation layer 50 is formed. Furthermore, on the insulating layer 2131, an insulating layer 2133 is formed so as to cover the charge accumulation layer 50, and on this insulating layer 2133, a semiconductor layer 60 is formed. Then, on this semiconductor layer 60, a read-only gate 170 is formed via an insulating layer 2133 so as to cover the semiconductor layer 60.

In the nonvolatile semiconductor memory of this embodiment, a control gate 170 with an area larger than that of the semiconductor layer 60 is formed above the semiconductor layer 60, and this control gate 170 functions as a shielding layer. Namely, by the control gate 170, electromagnetic waves or light is prevented from entering the semiconductor layer 60 from above. As a result, discrimination between a writing state and an erasing state can be made stably.

Figure 7:
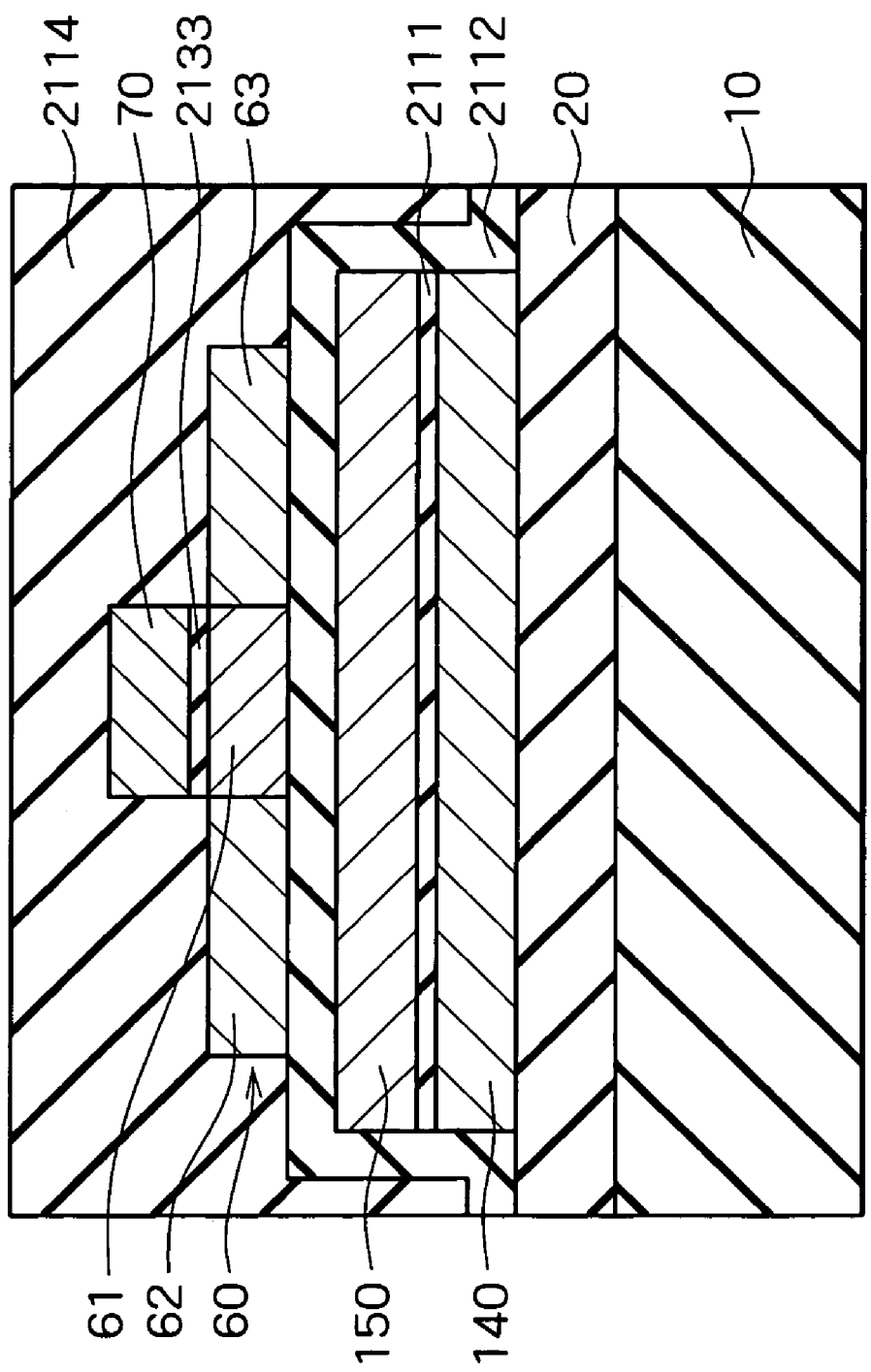
FIG. 7 is a sectional view showing the configuration of a nonvolatile semiconductor memory of a seventh embodiment of the invention.

Next, a nonvolatile semiconductor memory according to a seventh embodiment of the invention is described. FIG. 7 is a sectional view showing the configuration of the nonvolatile semiconductor memory of the seventh embodiment of the invention. In FIG. 7, the same components as those of the nonvolatile semiconductor memory shown in FIG. 1 through FIG. 6 are attached with the same symbols, and detailed description thereof is omitted. As shown in FIG. 7, in the nonvolatile semiconductor memory of this embodiment, on a base insulating layer 20 formed on an insulating substrate 10, a control gate 140 with an area larger than that of the semiconductor layer 60 is provided, and on this control gate 140, a charge accumulation layer 150 with an area larger than the semiconductor layer 60 is provided via an insulating layer 2111. Furthermore, an insulating layer 2112 is formed so as to cover the control gate 140, the insulating layer 2111, and the charge accumulation layer 150, and on the portion of the insulating layer 2112 immediately above the charge accumulation layer 150, a semiconductor layer 60 is formed. Furthermore, on the channel region 61 of this semiconductor layer 60, a read-only gate 70 is formed via an insulating layer 2113, and an insulating layer 2114 is formed so as to cover the semiconductor layer 60, the insulating layer 2113, and the read-only gate 70.

In the nonvolatile semiconductor memory of this embodiment, the charge accumulation layer 150 and the control gate 140 having areas larger than the area of the semiconductor layer 60 are provided below the semiconductor layer 60, and by these, electromagnetic waves or light is prevented from entering the semiconductor layer 60 from below. In this nonvolatile semiconductor memory, the charge accumulation layer 150 is formed so as to have an area larger than the semiconductor layer 60 as well as the control gate 140, whereby the electromagnetic wave and light shielding effect is improved more than in the nonvolatile semiconductor memory of the above-mentioned third embodiment. The construction, operations, and effects of the nonvolatile semiconductor memory of this embodiment except for the above-mentioned points are the same as those of the nonvolatile semiconductor memory of the third embodiment.

Figure 8:
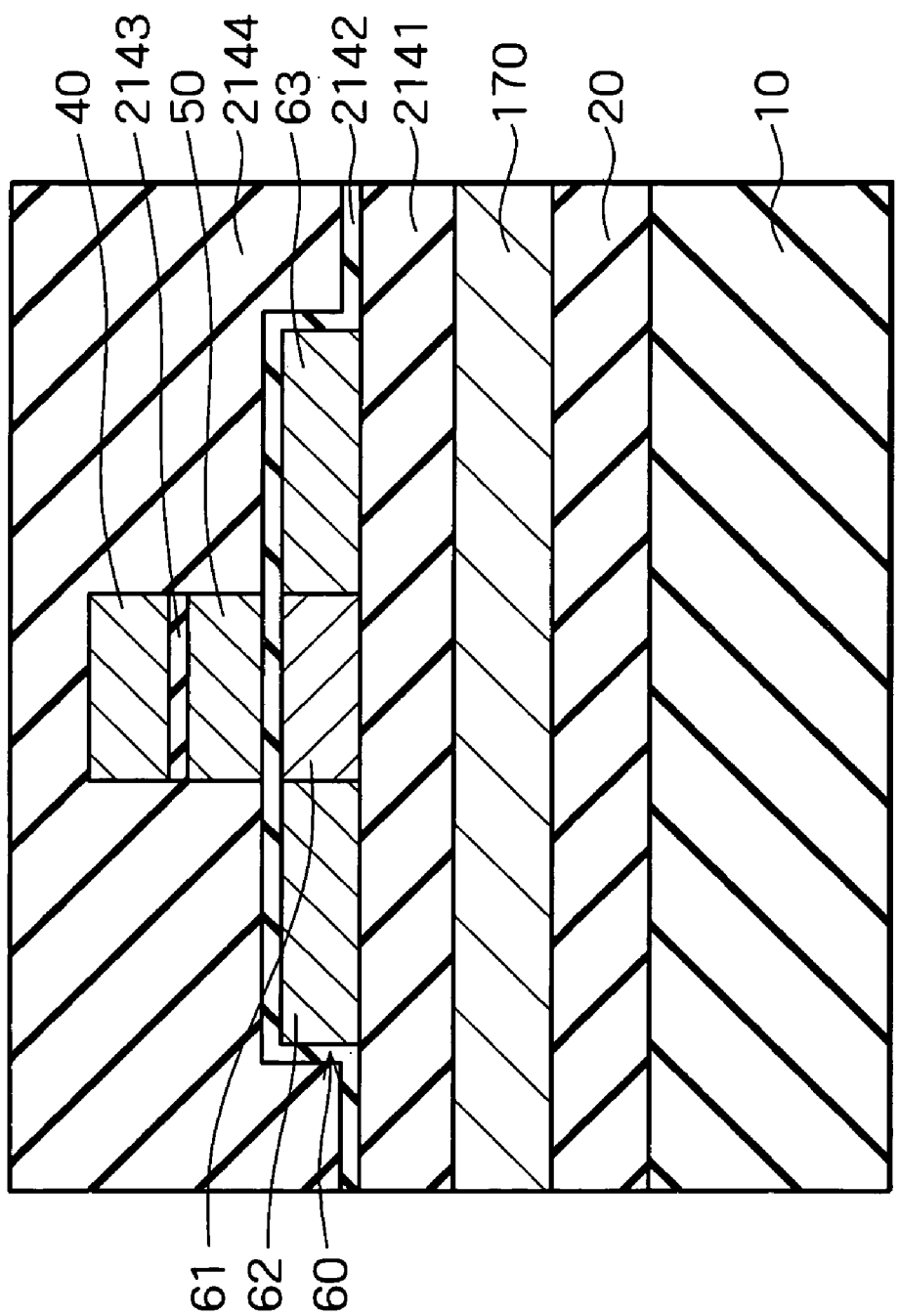
FIG. 8 is a sectional view showing the configuration of a nonvolatile semiconductor memory of an eighth embodiment of the invention.

Next, a nonvolatile semiconductor memory according to an eighth embodiment of the invention is described. FIG. 8 is a sectional view showing the configuration of the nonvolatile semiconductor memory of the eighth embodiment of the invention. In FIG. 8, the same components as those of the nonvolatile semiconductor memory shown in FIG. 1 through FIG. 7 are attached with the same symbols, and detailed description thereof is omitted. As shown in FIG. 8, in the nonvolatile semiconductor memory of this embodiment, on the base insulating layer 20 formed on the insulating substrate 10, a read-only gate 170 having an area larger than the semiconductor layer 60 is formed, and the semiconductor layer 60 is formed on the read-only gate 70 via an insulating layer 2141. On the channel region 61 of the semiconductor layer 60, a charge accumulation layer 50 is formed via an insulating layer 2142, and on the charge accumulation layer 50, a control gate 40 is formed via an insulating layer 2143, and furthermore, an insulating layer 2144 is formed so as to cover the charge accumulation layer 50, the insulating layer 2143, and the control gate 40.

In the nonvolatile semiconductor memory of this embodiment, the read-only gate 170 having an area larger than that of the semiconductor layer 60 is provided below the semiconductor layer 60, and this read-only gate 170 functions as a shielding layer. Thereby, electromagnetic waves or light can be prevented from entering the semiconductor layer 60 from below, so that discrimination between a writing state and an erasing state can be made stably, and the manufacturing processes can be simplified. The effects and operations of the nonvolatile semiconductor memory of this embodiment except for the above-mentioned points are the same as those of the nonvolatile semiconductor memory of the second embodiment.

Figure 9:
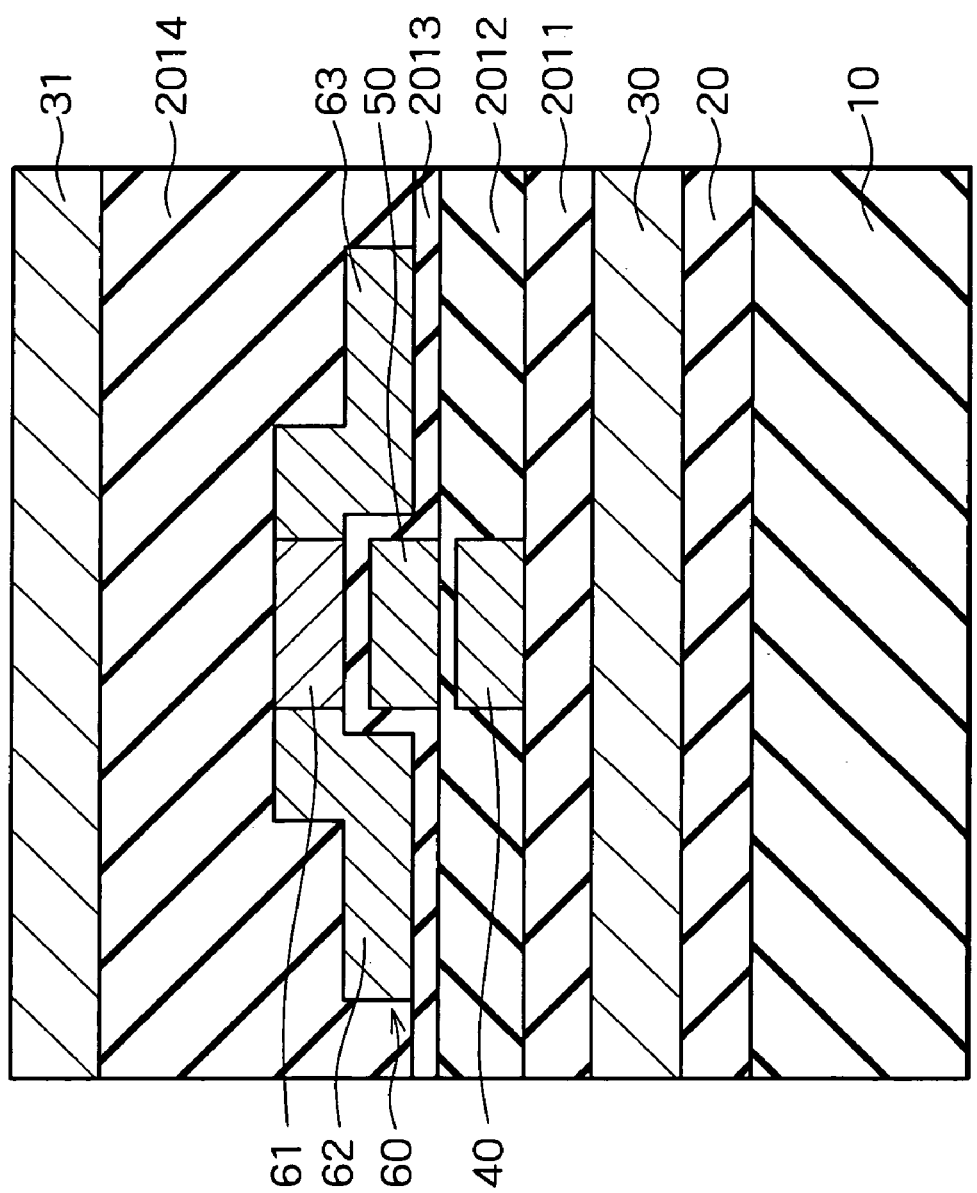
FIG. 9 is a sectional view showing the configuration of a nonvolatile semiconductor memory of a ninth embodiment of the invention.

Next, a nonvolatile semiconductor memory according to a ninth embodiment of the invention is described. FIG. 9 is a sectional view showing the configuration of the nonvolatile semiconductor memory of the ninth embodiment of the invention. In FIG. 9, the same components as those of the nonvolatile semiconductor memory shown in FIG. 1 through FIG. 8 are attached with the same symbols, and detailed description thereof is omitted. As shown in FIG. 9, in the nonvolatile semiconductor memory of this embodiment, on an insulating substrate 10 made of glass or plastic, a base insulating layer 20 is formed. On this base insulating layer 20, a shielding layer 30 having either an electromagnetic wave shielding effect or a light shielding effect or both of these is formed. On the shielding layer 30, a control gate 40 is provided via an insulating layer 2011, and on the insulating layer 2011, an insulating layer 2012 is formed so as to cover the control gate 40. On the portion of the insulating layer 2012 immediately above the control gate 40, a charge accumulation layer 50 is provided, and an insulating layer 2013 is further formed so as to cover the charge accumulation layer 50. Furthermore, on the insulating layer 2013, a semiconductor layer 60 is provided, and on the portion of the semiconductor layer 60 immediately above the charge accumulation layer 50, a channel region 61 is formed, and on both sides of the channel region 61, a source region 62 and a drain region 63 are formed, respectively. Furthermore, on the insulating layer 2013, an insulating layer 2014 is formed so as to cover the semiconductor layer 60, and a shielding layer 31 having either an electromagnetic wave shielding effect or a light shielding effect or both of these is formed on the insulating layer 2014.

Next, operations of the nonvolatile semiconductor memory of this embodiment are described. In the nonvolatile semiconductor memory of this embodiment, when a predetermined voltage is applied to the source region 62 and the drain region 63 formed in the semiconductor layer 60 and the control gate 40, a Fowler Nordheim tunneling current is generated, and electrons move between the channel region 61 and the charge accumulation layer 50 via the insulating layer 2013. When charges are accumulated in the charge accumulation layer 50, an electrical field is generated, so that the threshold voltage of the transistor changes and data is stored. To readout data, for example, a middle voltage between a threshold voltage in an erasing state and a threshold voltage in a writing state is applied to the control gate 40 and it is measured whether or not a current flows between the source region 62 and the drain region 63.

In the nonvolatile semiconductor memory of this embodiment, shielding layers 30 and 31 are provided above and below the semiconductor layer 60, respectively, and furthermore, the shielding layers 30 and 31 are formed to have areas larger than the area of the semiconductor layer 60, so that electromagnetic waves and light can be efficiently prevented from entering the semiconductor layer 60. Thereby, the leak current in the broad sense of the term can be significantly reduced, and discrimination between a writing state and an erasing state can be made stably. The shielding layers 30 and 31 may be formed by a material having metallic properties such as a semiconductor material doped with metal materials and impurities.

The nonvolatile semiconductor memory of this embodiment is provided without a read-only gate, and performs writing and reading by the control gate 40. Therefore, when carriers are injected from the semiconductor layer 60 to the charge accumulation layer 50, in a case where a part of the carriers is captured in the insulating layer 2013 or the quality of the insulating layer 2013 changes due to carrier injection, there is possibility that a change in threshold voltage for the gate for reading becomes greater than in the nonvolatile semiconductor memory of the third embodiment having a read-only gate, and the reading margin lowers. However, for example, in a case where only writing or erasing is performed once and only reading is performed thereafter, there is no influence from carrier capture in the insulating layer 2013 and the change of quality of the insulating layer 2013, so that this structure does not pose a problem.

Figure 10:
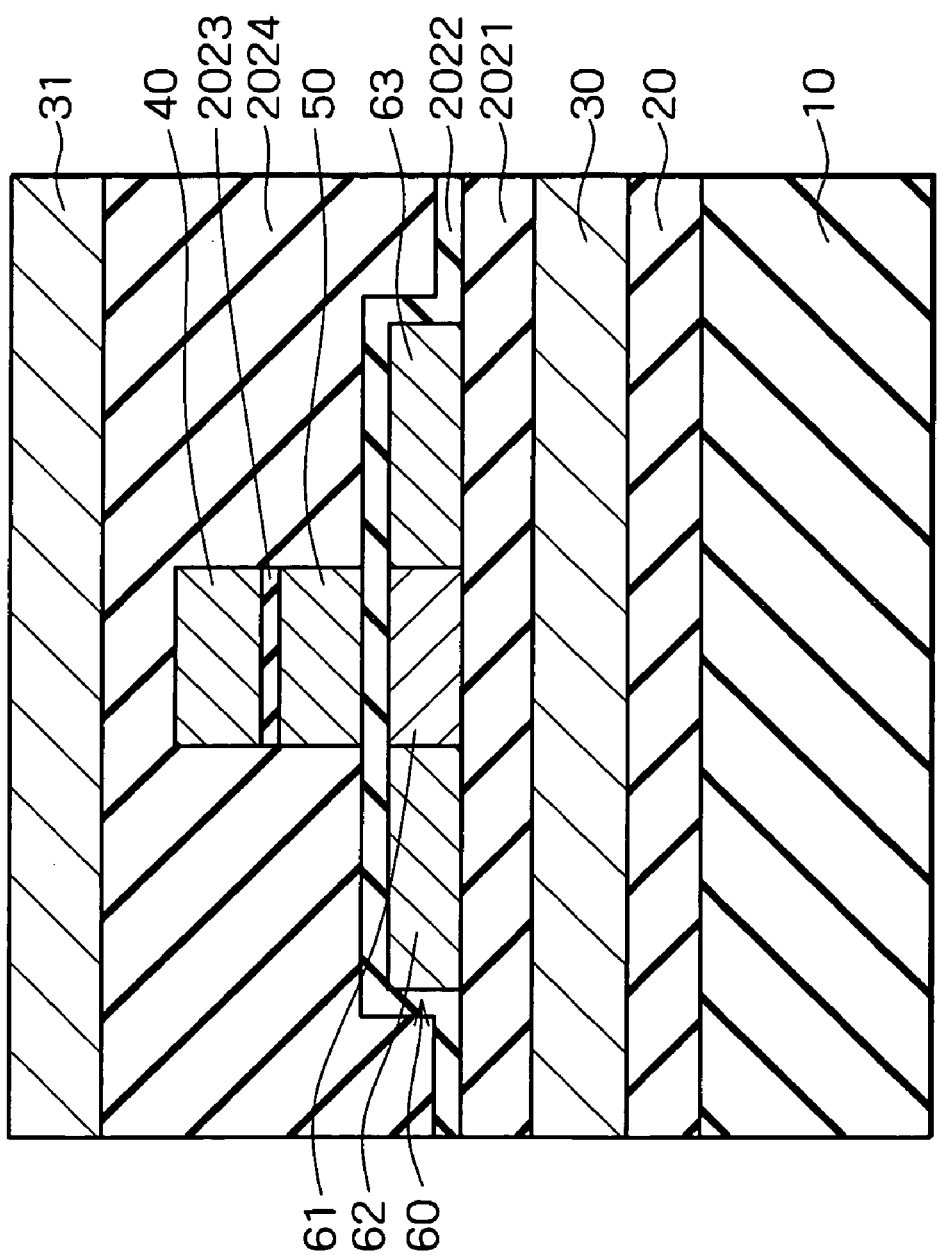
FIG. 10 is a sectional view showing the configuration of a nonvolatile semiconductor memory of a tenth embodiment of the invention.

Next, a nonvolatile semiconductor memory according to a tenth embodiment of the invention is described. FIG. 10 is a sectional view showing the configuration of the nonvolatile semiconductor memory of the tenth embodiment of the invention. In FIG. 10, the same components as those of the nonvolatile semiconductor memory shown in FIG. 1 through FIG. 9 are attached with the same symbols and detailed description thereof is omitted. As shown in FIG. 10, in the nonvolatile semiconductor memory of this embodiment, a semiconductor layer 60 is formed on an insulating layer 2021. On the channel-region 61 of this semiconductor layer 60, a charge accumulation layer 50 is formed via an insulating layer 2022, and on this charge accumulation layer 50, a control gate 40 is formed via an insulating layer 2023.

Even when a control gate 40 and a charge accumulation layer 50 are provided above the semiconductor layer like the nonvolatile semiconductor memory of this embodiment, the same effects as in the nonvolatile semiconductor memory of the eighth embodiment can be obtained. The construction and operations of the nonvolatile semiconductor memory of this embodiment except for the above-mentioned points are the same as those of the nonvolatile semiconductor memory of the seventh embodiment.

Figure 11:
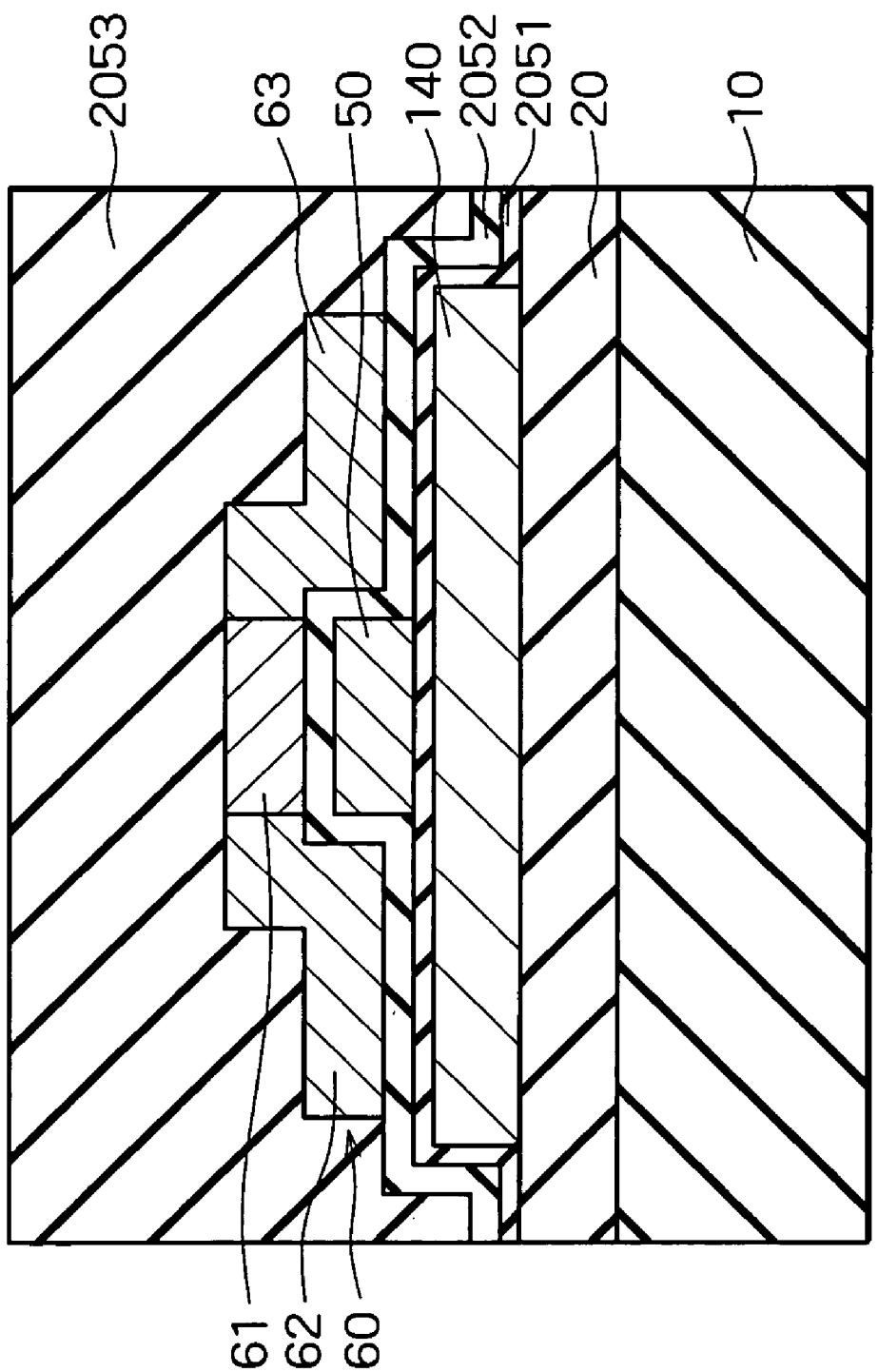
FIG. 11 is a sectional view showing the configuration of a nonvolatile semiconductor memory of an eleventh embodiment of the invention.

Next, a nonvolatile semiconductor memory according to an eleventh embodiment of the invention is described. FIG. 11 is a sectional view showing the configuration of the nonvolatile semiconductor memory of the eleventh embodiment of the invention. In FIG. 11, the same components as those of the nonvolatile semiconductor memory shown in FIG. 1 through FIG. 10 are attached with the same symbols and detailed description thereof is omitted. As shown in FIG. 10, in the nonvolatile semiconductor memory of this embodiment, a base insulating layer 20 is formed on an insulating substrate 10 made of glass or plastic, and on this base insulating layer 20, a control gate 140 having an area larger than that of the semiconductor layer 60 is provided, and the shielding layer is not provided.

In the nonvolatile semiconductor memory of this embodiment, in place of a shielding layer, the control gate 140 covers the region below the semiconductor layer 60. Namely, the control gate 140 functions as a shielding layer. Thereby, electromagnetic waves and light can be prevented from entering the semiconductor layer from below, so that discrimination between a writing state and an erasing state can be made stably. The construction, operations, and effects of the nonvolatile semiconductor memory of this embodiment except for the above-mentioned points are the same as those of the nonvolatile semiconductor memory of the eighth embodiment.

Figure 12:
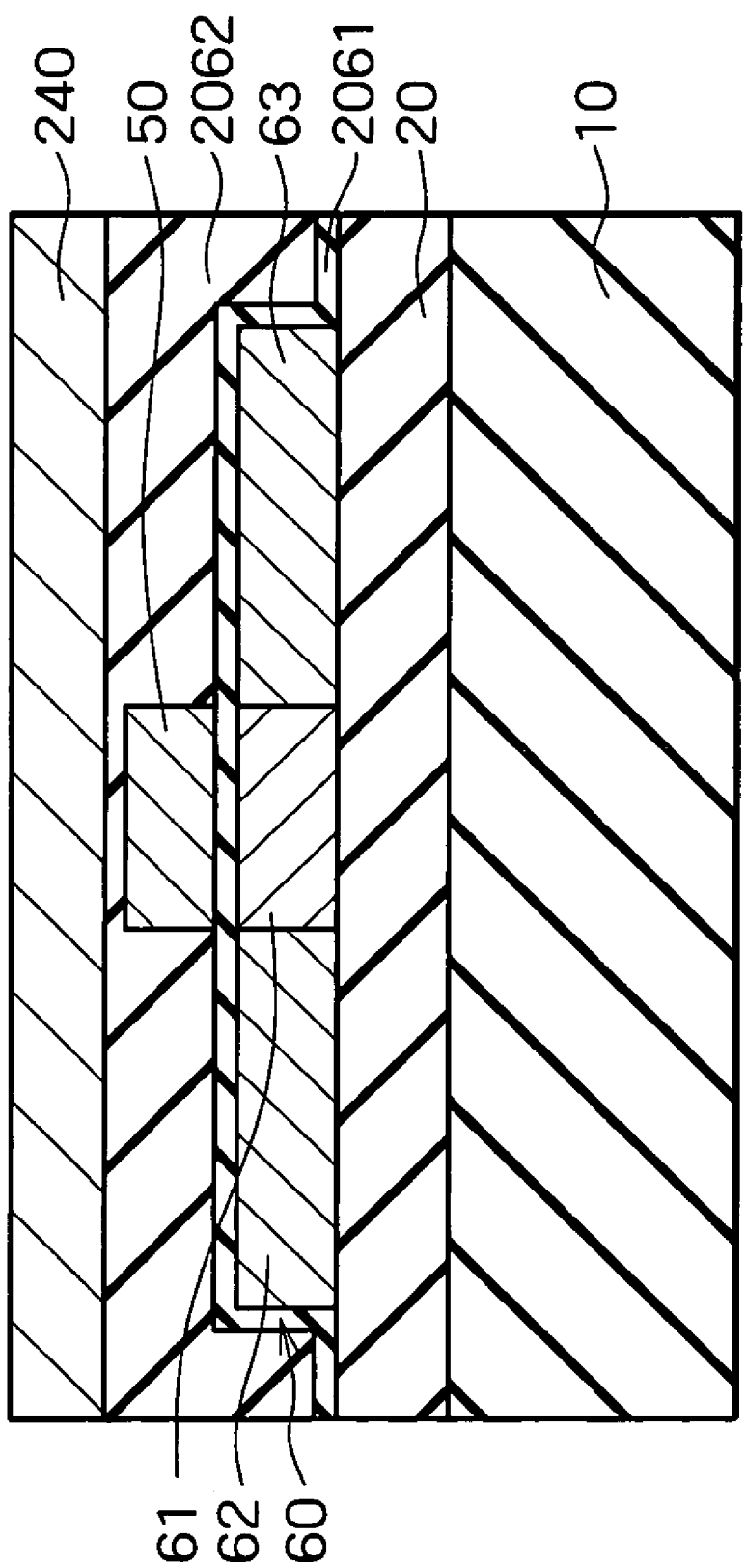
FIG. 12 is a sectional view showing the configuration of a nonvolatile-semiconduct or memory of a twelfth embodiment of the invention.

Next, a nonvolatile semiconductor memory relating to a twelfth embodiment of the invention is described. FIG. 12 is a sectional view showing the configuration of the nonvolatile semiconductor memory of the twelfth embodiment of the invention. In FIG. 12, the same components as those of the nonvolatile semiconductor memory shown in FIG. 1 through FIG. 11 are attached with the same symbols and detailed description thereof is omitted. As shown in FIG. 12, in the nonvolatile semiconductor memory of this embodiment, a semiconductor layer 60 is formed on a base insulating layer 20 formed on an insulating substrate 10. On the channel region 61 of this semiconductor layer 60, a charge accumulation layer 50 is formed via an insulating layer 2061, and on this charge accumulation layer 50, a control gate 240 having an area larger than the semiconductor layer 60 is formed via an insulating layer 2062.

Thus, in the nonvolatile semiconductor memory of this embodiment, in place of a shielding layer, the control gate 240 having an area larger than the semiconductor layer 60 is provided above the semiconductor layer 60 so as to cover the entire surface region of the semiconductor layer 60. In this nonvolatile semiconductor memory, the control gate 240 functions as a shielding layer, and prevents electromagnetic waves or light from entering the semiconductor layer 60 from above. As a result, discrimination between a writing state and an erasing state can be made stably. The effects and operations of the nonvolatile semiconductor memory of this embodiment except for the above-mentioned points are the same as those of the nonvolatile semiconductor memory of the eighth embodiment.

Figure 13:
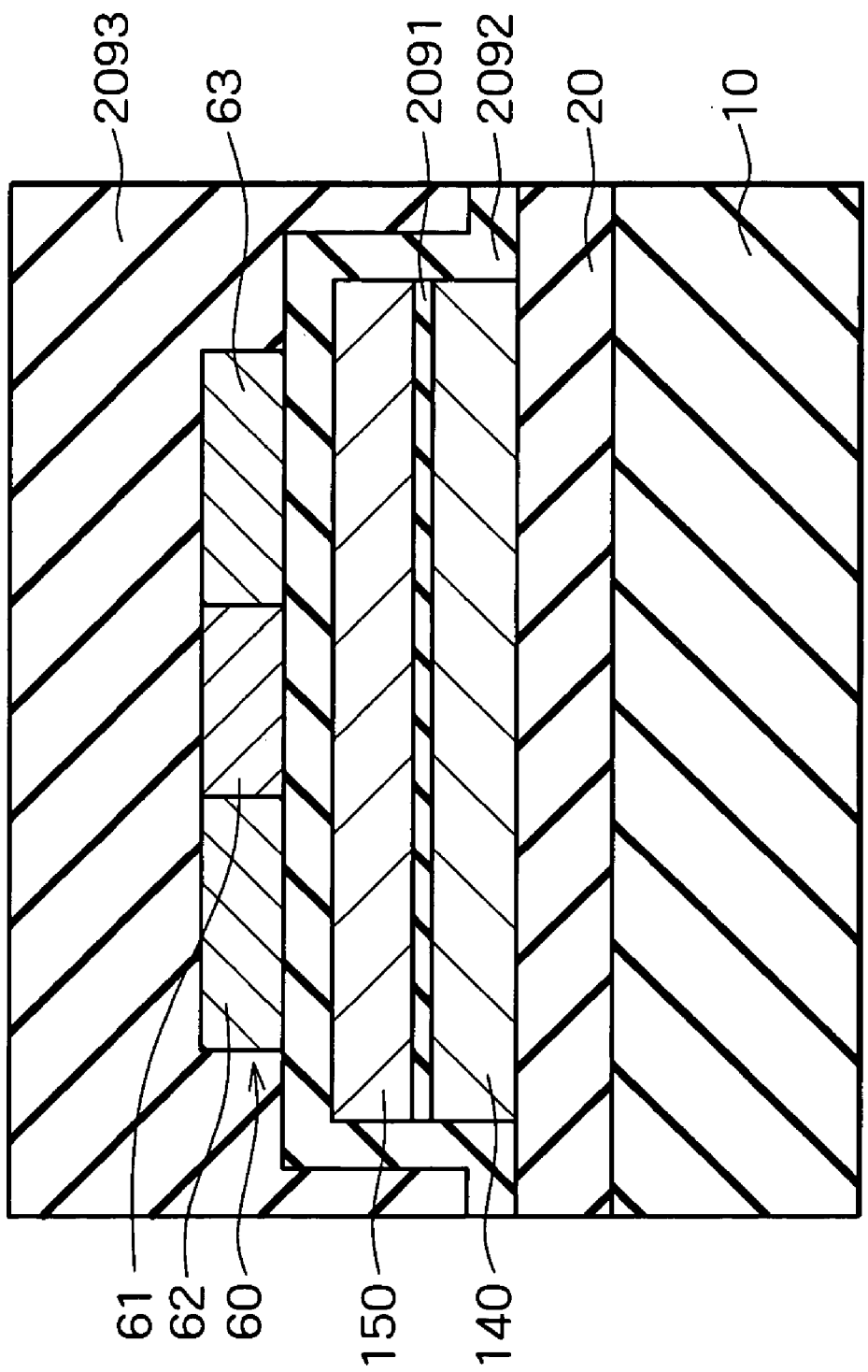
FIG. 13 is a sectional view showing the configuration of a nonvolatile semiconductor memory of a thirteenth embodiment of the invention.

Next, a nonvolatile semiconductor memory according to a thirteenth embodiment of the invention is described. FIG. 13 is a sectional view showing the configuration of the nonvolatile semiconductor memory of the thirteenth embodiment of the invention. In FIG. 13, the same components as those of the nonvolatile semiconductor memory shown in FIG. 1 through FIG. 12 are attached with the same symbols and detailed description thereof is omitted. As shown in FIG. 13, in the nonvolatile semiconductor memory of this embodiment, a control gate 140 having an area larger than the semiconductor layer 60 is provided on a base insulating layer 20 formed on an insulating substrate 10, and on this control gate, a charge accumulation layer 150 having an area larger than the semiconductor layer 60 is provided via an insulating layer 2091. Furthermore, an insulating layer 2091 is formed so as to cover the control gate 140, the insulating layer 2091, and the charge accumulation layer 150, and on the portion of the insulating layer 2091 immediately above the charge accumulation layer 150, a semiconductor layer 60 is formed.

Thus, in the nonvolatile semiconductor memory of this embodiment, the charge accumulation layer 150 and the control gate 140 having areas larger than the semiconductor layer 60 are provided, and by these, electromagnetic waves or light is prevented from entering the semiconductor layer 60 from below. In this nonvolatile semiconductor memory, the charge accumulation layer 150 is formed so as to have an area larger than the semiconductor layer 60 as well as the control gate 140, so that the electromagnetic wave and light shielding effect is improved more than in the nonvolatile semiconductor memory of the ninth embodiment. The construction, operations and effects of the nonvolatile semiconductor memory of this embodiment except for the above-mentioned points are the same as those of the nonvolatile semiconductor memory of the ninth embodiment.

Figure 14:
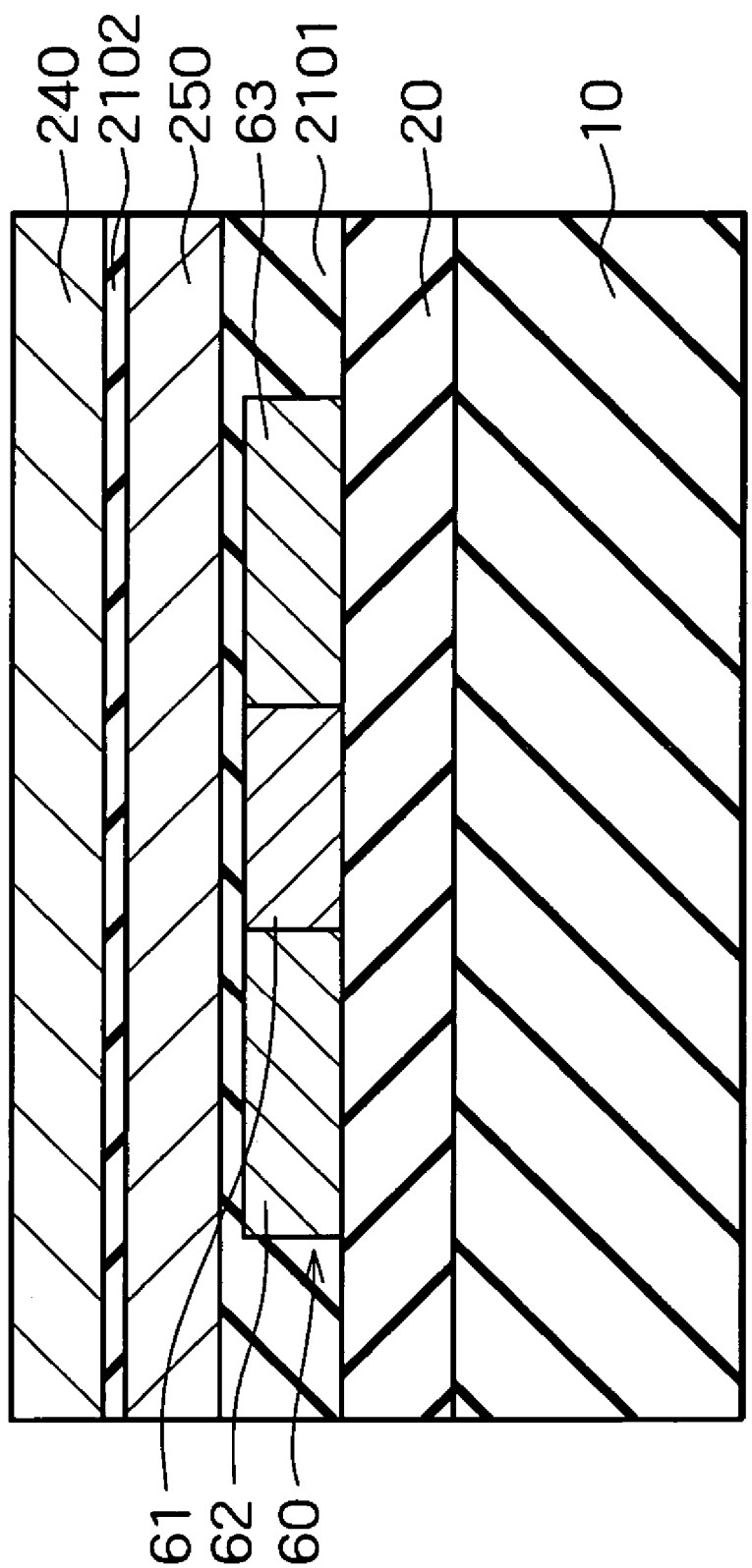
FIG. 14 is a sectional view showing the configuration of a nonvolatile semiconductor memory of a fourteenth embodiment of the invention.

Next, a nonvolatile semiconductor memory according to fourteenth embodiment of the invention is described. FIG. 14 is a sectional view showing the configuration of the nonvolatile semiconductor memory of the fourteenth embodiment of the invention. In FIG. 14, the same components as those of the nonvolatile semiconductor memory shown in FIG. 1 through FIG. 13 are attached with the same symbols, and detailed description thereof is omitted. As shown in FIG. 14, in the nonvolatile semiconductor memory of this embodiment, a charge accumulation layer 250 having an area larger than the semiconductor layer 60 is provided above the semiconductor layer 60, and on this charge accumulation layer 250, a control gate 240 having an area larger than the semiconductor layer 60 is formed via an insulating layer 2102.

Thus, in the nonvolatile semiconductor memory of this embodiment, the charge accumulation layer 250 and the control gate 240 having areas larger than the semiconductor layer 60 are provided above the semiconductor layer 60, and by these, electromagnetic waves or light is prevented from entering the semiconductor layer 60 from above. In this nonvolatile semiconductor memory, the charge accumulation layer 250 is formed so as to have an area larger than the semiconductor layer 60 as well as the control gate 240, so that the electromagnetic wave and light shielding effect is improved more than in the nonvolatile semiconductor memory of the tenth embodiment. The construction, operations, and effects of the nonvolatile semiconductor memory of this embodiment except for the above-mentioned points are the same as those of the nonvolatile semiconductor memory of the tenth embodiment.

In the nonvolatile semiconductor memory of the third through eighth and eleventh through fourteenth embodiments, it is also possible that the control gate, the charge accumulation layer or the read-only gate are also formed in the upper and/or lower regions of the transistor of a peripheral circuit that does not need these, and are used as shielding layers for shielding electromagnetic waves and light entering the transistor of the peripheral circuit.

Furthermore, in the nonvolatile semiconductor memory of the first through fourteenth embodiments, LDD (Lightly-Doped Drain) regions may be provided between the source region 62, the drain region 63, and the channel region 61 in the semiconductor layer 60. Thereby, the electrical field generated at the source terminal and the drain terminal in the case of writing and erasing becomes smaller, so that the reliability is improved, and deterioration in reading margin due to many numbers of times of writing and erasing can be restrained.

Furthermore, in the nonvolatile semiconductor memory of the second through fourteenth embodiments, in comparison with the nonvolatile semiconductor memory of the first embodiment, the number of layers to be formed is only smaller or the order of formation of the layers is only different, so that the nonvolatile semiconductor memory of the second through fourteenth embodiments can be manufactured by the same method as that for the nonvolatile semiconductor memory of the first embodiment.

In the nonvolatile semiconductor memory of the first through fourteenth embodiments, as the insulating substrate 10, an inexpensive insulating substrate such as a glass substrate and a plastic substrate can be used, so that in comparison with the case of using a silicon substrate, the device can be manufactured at low cost, and this is effective for reduction in cost of a nonvolatile memory having a charge accumulation layer such as a flash memory.

Furthermore, the nonvolatile semiconductor memory of the first through fourteenth embodiments have an electromagnetic wave shielding function, so that at a location near these, an antenna for receiving electromagnetic waves, an amplifier for amplifying faint signals, and a signal demodulator, etc., are allowed to be placed, and a function device including an analog signal processing circuit and a digital signal processing circuit such as a logic circuit, etc., can be formed on the same substrate. Therefore, these nonvolatile semiconductor memory are preferable for nonvolatile memories that are used in RF-ID (Radio Frequency IDentification) systems for identifying personal and object data by radio waves in a non-contact manner via antennas that relay communications by attaching tags to persons and objects. Thereby, RF-ID systems can be manufactured at low cost.

What is claimed is:

1. A nonvolatile semiconductor memory comprising:
an insulating substrate;
a memory transistor formed on said insulating substrate, said memory transistor including
a semiconductor layer having a source region, a drain region, and a channel region formed between said source region and said drain region,
a charge accumulation layer separated from said channel region by a first insulating layer, and
a first gate separated from said charge accumulation layer by a second insulating layer; and
a shielding layer having an electromagnetic wave shielding effect or a light shielding effect, or having both the electromagnetic shielding effect and the light shielding effect formed on at least one of the upper side or the lower side of said memory transistor, wherein said shielding layer is a semiconductor material doped with metal impurities.

2. The nonvolatile semiconductor memory according to claim 1, wherein said shielding layer is formed in an area larger than said semiconductor layer so as to cover the portion immediately below or immediately above the semiconductor layer.

3. The nonvolatile semiconductor memory according to claim 1, wherein in said memory transistor, said charge accumulation layer is formed on said channel region via said first insulating layer, and said first gate is formed on said charge accumulation layer via said second insulating layer.

4. The nonvolatile semiconductor memory according to claim 3, wherein said memory transistor further has a second gate that is formed below said channel region and separated from said channel region by a third insulating layer.

5. The nonvolatile semiconductor memory according to claim 1, wherein said insulating substrate is formed of glass or plastic.

6. The nonvolatile semiconductor memory according to claim 1, wherein said shielding layer is formed on both the upper side and the lower side of said memory transistor.

7. A nonvolatile semiconductor memory comprising:
an insulating substrate;
a memory transistor formed on said insulating substrate, said memory transistor including
   a semiconductor layer having a source region, a drain region, and a channel region formed between said source region and said drain region,
   a charge accumulation layer separated from said channel region by a first insulating layer, and
   a first gate separated from said charge accumulation layer by a second insulating layer; and
a shielding layer having an electromagnetic wave shielding effect or a light shielding effect, or having both the electromagnetic shielding effect and the light shielding effect formed on at least one of the upper side or the lower side of said memory transistor,
wherein in said memory transistor, said charge accumulation layer is formed on said first gate via said second insulating layer, and said channel region is formed on said charge accumulation layer via said first insulating layer, and
wherein said shielding layer is a semiconductor material doped with metal impurities.

8. The nonvolatile semiconductor memory according to claim 7, wherein said memory transistor further has a second gate that is formed above said channel region and separated from said channel region by a third insulating layer.

9. A nonvolatile semiconductor memory comprising:
an insulating substrate;
a memory transistor formed on said insulating substrate, said memory transistor including
   a semiconductor layer having a source region, a drain region, and a channel region formed between said source region and said drain region,
   a charge accumulation layer separated from said channel region by a first insulating layer, and
   a first gate separated from said charge accumulation layer by a second insulating layer; and
a shielding layer having an electromagnetic wave shielding effect or a light shielding effect, or having both the electromagnetic shielding effect and the light shielding effect formed on at least one of the upper side or the lower side of said memory transistor,
wherein said shielding layer is one of tungsten silicide, amorphous silicon or chromium.

* * * * *